(12) United States Patent
Gabriel Bergas et al.

(10) Patent No.: US 9,360,506 B2
(45) Date of Patent: Jun. 7, 2016

(54) SYSTEM AND METHOD OF MONITORING THE WAVEFORM OF THE VOLTAGE OF THE ELECTRICAL GRID

(75) Inventors: Joan Gabriel Bergas, Barcelona (ES); Joaquim López Mestre, Argentona (ES); Hector Ali Rivas Guerrero, San Cristóbal (VE); Natalia Sangroniz Palacio, Mungia (ES); César Chávez Soria, Naucalpan (MX)

(73) Assignee: ARTECHE LANTEGI ELKARTEA, S.A., Mungia (Vizcaya) (ES)

( * ) Notice: Subject to any disclaimer, the term of this patent is extended or adjusted under 35 U.S.C. 154(b) by 348 days.

(21) Appl. No.: 14/000,025

(22) PCT Filed: Feb. 18, 2011

(86) PCT No.: PCT/ES2011/070105
§ 371 (c)(1),
(2), (4) Date: Nov. 20, 2013

(87) PCT Pub. No.: WO2012/110670
PCT Pub. Date: Aug. 23, 2012

(65) Prior Publication Data
US 2014/0062458 A1   Mar. 6, 2014

(51) Int. Cl.
G01R 19/00 (2006.01)
G01R 19/25 (2006.01)
H02J 3/18 (2006.01)

(52) U.S. Cl.
CPC ........... *G01R 19/2513* (2013.01); *H02J 3/1864* (2013.01); *Y02E 40/12* (2013.01)

(58) Field of Classification Search
CPC ... G01R 13/2513; G02J 3/1864; Y02E 40/12; Y02E 40/30; G05F 1/70
USPC .................. 324/76.11, 76.77, 66, 141, 87, 86
See application file for complete search history.

(56) References Cited

U.S. PATENT DOCUMENTS

| 5,434,497 A * | 7/1995 | Larsen | H02J 3/1864 323/209 |
| 6,982,546 B2 * | 1/2006 | Wu | G05F 1/70 323/205 |

(Continued)

OTHER PUBLICATIONS

Phipps et al. "Three-Phase Phase-Locked Loop Control of a New Generation Power Converter," Industrial Electronics and Applications, 2006 1st IEEE Conference on. IEEE, 2006.*

(Continued)

*Primary Examiner* — Arleen M Vazquez
*Assistant Examiner* — Lee Rodak
(74) *Attorney, Agent, or Firm* — Florek & Endres PLLC

(57) ABSTRACT

The present invention relates to a system for monitoring the electric network voltage waveform, comprising: switching means (11) connected to the voltage lines (A, B, C) of a three-phase system, comprising two thyristors (T1, T2) connected to two of the voltage lines (A, B, C) and at least two capacitors (C1, C2) connected to said thyristors (T1, T2), said means (11) being configured to open and close said thyristors (T1, T2) in response to a trigger signal; means for measuring (12) the voltages in said voltage lines and at the input of said capacitors; a thyristor trigger circuit (14) for providing a trigger signal to either thyristor (DT1, DT2) when the voltage in the terminals of said thyristor (T1, T2) crosses zero; control means (13, 23) for giving said trigger order (OD) or not. The control means comprise: a PLL (231, 331) configured to obtain an image signal from the voltage signals of said voltage lines (A, B, C), from the phase angle (φ) of the three-phase system and from the temporal variation thereof; an adaptive notch filter (232, 432) for providing filtered voltage signals between the voltage lines ($V_{AC\_f}$, $V_{BC\_f}$); means for filtering the voltages at the input of the capacitors ($V_{C1\_f}$, $V_{C2\_f}$); a zero crossing detector (235, 535) configured to provide said trigger order (OD).

8 Claims, 4 Drawing Sheets

(56) References Cited

U.S. PATENT DOCUMENTS

2004/0062062 A1* 4/2004 Lee .................... H02P 21/0092
363/37
2011/0291596 A1* 12/2011 Lu ........................... H02P 27/16
318/400.09

OTHER PUBLICATIONS

Eren et al. "Enhanced Frequency-Adaptive Phase-Locked Loop for Distributed Power Generation System Applications." World Wind Energy Conf., Kingston, Canada. 2008.*

Rivas et al. "Frequency determination in a Single-Phase Voltage Signal using Adaptive Notch Filters," 9th International conference on Electrical Power Quality and Utilisation, 2007.*

Texas Instruments, Digital Control Systems (DCS) Group, "Clarke variable transformation".

Texas Instruments, Digital Control Systems (DCS) Group, "Park variable transformation".

Texas Instruments, "Digital PID Controller with Anti-windup".

* cited by examiner

SYSTEM AND METHOD OF MONITORING THE WAVEFORM OF THE VOLTAGE OF THE ELECTRICAL GRID

REFERENCE TO RELATED APPLICATIONS

This application is a U.S. National Stage filing under 35 U.S.C. §371 of International Application No. PCT/ES2011/070105, filed Feb. 18, 2011.

TECHNICAL FIELD

The present invention belongs to the field of power systems. The present invention more particularly relates to systems for monitoring the electric network voltage waveform.

DESCRIPTION OF THE STATE OF THE ART

Systems for monitoring the quality of the voltage of alternating current (AC) lines are known. These systems are responsible for monitoring the voltage in the event of detecting an incorrect line voltage. Once the error is detected, these systems are capable of restoring the voltage if the error is within determined limits. However, errors commonly occur which lead to the voltage of the line being outside that range.

Another problem relating to power lines is the presence of harmonics in the line. The cause may be, among others, the presence of nonlinear loads. These unwanted harmonics present in the form alternating currents (AC) in the power line at frequencies different from the nominal line frequency (for example, 50 Hz in Europe, 60 Hz in the United States).

United States patent application US 200510207190 A1 describes a power system having a phase lock loop (PLL) with a notch filter (also referred to as band suppression filter, band-stop filter or band-rejection filter). The notch filter serves to remove certain disturbances, such as harmonics. This filter is tuned to the network frequency, which is fixed (60 Hz in the system described in this document).

On the other hand, Japanese patent application JP11032483 A describes a system for eliminating incorrect switching of the thyristors of a power converter. This document also uses a notch filter to remove harmonics. As in the preceding case, the filter is tuned to the network frequency, which is fixed.

However, the proposals described in both documents do not allow the device to automatically adapt to the network frequency. This prevents its adaptation to systems with less standard frequencies (for example, in railway or airport networks) or even the adaptation from a standard system at a frequency (for example, the European system at 50 Hz) to another standard system at a different frequency (for example, the United States system at 60 Hz).

SUMMARY OF THE INVENTION

The present invention solves the problems discussed above by offering a completely adaptable system and method since the frequency to which the notch filter is tuned automatically adapts to the network frequency. Specifically, the system and method implement an electric network voltage waveform following algorithm that is immune to the disturbances.

In a first aspect, a system for monitoring the electric network voltage waveform is presented, comprising: switching means connected to the voltage lines of a three-phase system, wherein said means comprise two thyristors connected to two of the voltage lines, a third directly connected voltage line and at least two capacitors connected to said thyristors, said means being configured to open and close said thyristors in response to a corresponding trigger signal; means for measuring the voltages in said voltage lines and at the input of said capacitors; a thyristor trigger circuit configured to provide a trigger signal from a trigger order to either thyristor when the voltage in the terminals of said thyristor crosses zero; control means configured to give said trigger order from the measured voltages or not; wherein said control means comprise: a PLL configured to obtain an image signal from the voltage signals of said voltage lines, from the phase angle of the three-phase system and from the temporal variation thereof; an adaptive notch filter the constants of which are calculated from the derivative of said phase angle, i.e., the frequency, configured to provide filtered voltage signals between the voltage lines, wherein said filtered signals can represent frequencies different from the fundamental frequency; means for filtering the voltages at the input of the capacitors; a zero crossing detector configured to provide said trigger order from said filtered voltages.

Preferably, the switching means further comprise an inductor located between each thyristor and the corresponding capacitor.

Preferably, the PLL comprises: means for applying a Clarke transformation to the voltage signals to convert the balanced three-phase system into an orthogonal stationary quadrature two-phase system; means for applying a Park transformation to the two-phase quadrature to convert the orthogonal stationary two-phase system into a rotating orthogonal system; means for applying a proportional-integral-derivative control to obtain the rotation speed of the system and the frequency of the original electrical system; means for integrating said rotation speed and calculating the phase angle of the voltage from the rotation speed of the system; means for obtaining an inverse Park transformation to convert the quadrature rotating reference frame into an orthogonal stationary two-phase system; means for obtaining the inverse Park transformation to obtain an image of the original three-phase system.

Preferably, the adaptive notch filter is an all-pass filter. More preferably, it is a planar rotation lattice filter.

Preferably, the control means and the thyristor trigger circuit are configured to send the corresponding trigger signals when the following three conditions are simultaneously met: the trigger order is received; the voltage in the terminals of the thyristor is the same; the previous condition is not due to a disturbance.

Preferably, the system further comprises a reactive power regulating module configured to provide a connect/disconnect order to said control means.

In another aspect, a static switch is presented comprising the system for connecting and disconnecting the electric network voltage waveform described above.

Finally, a method for monitoring the electric network voltage waveform for calculating the zero crossings of the electric network voltage signal by means of the system described above is presented.

BRIEF DESCRIPTION OF THE DRAWINGS

A set of drawings is attached to complement the description and provide better understanding of the invention. These drawings are an integral part of the description and illustrate a preferred embodiment of the invention, which must not be interpreted as restricting the scope of the invention, but rather as an example of how to carry it out into practice. The drawings comprise the following figures.

The numbers and symbols in the different figures refer to corresponding parts of the remaining figures unless indicated otherwise.

DESCRIPTION OF PREFERRED EMBODIMENTS

Figure 1:
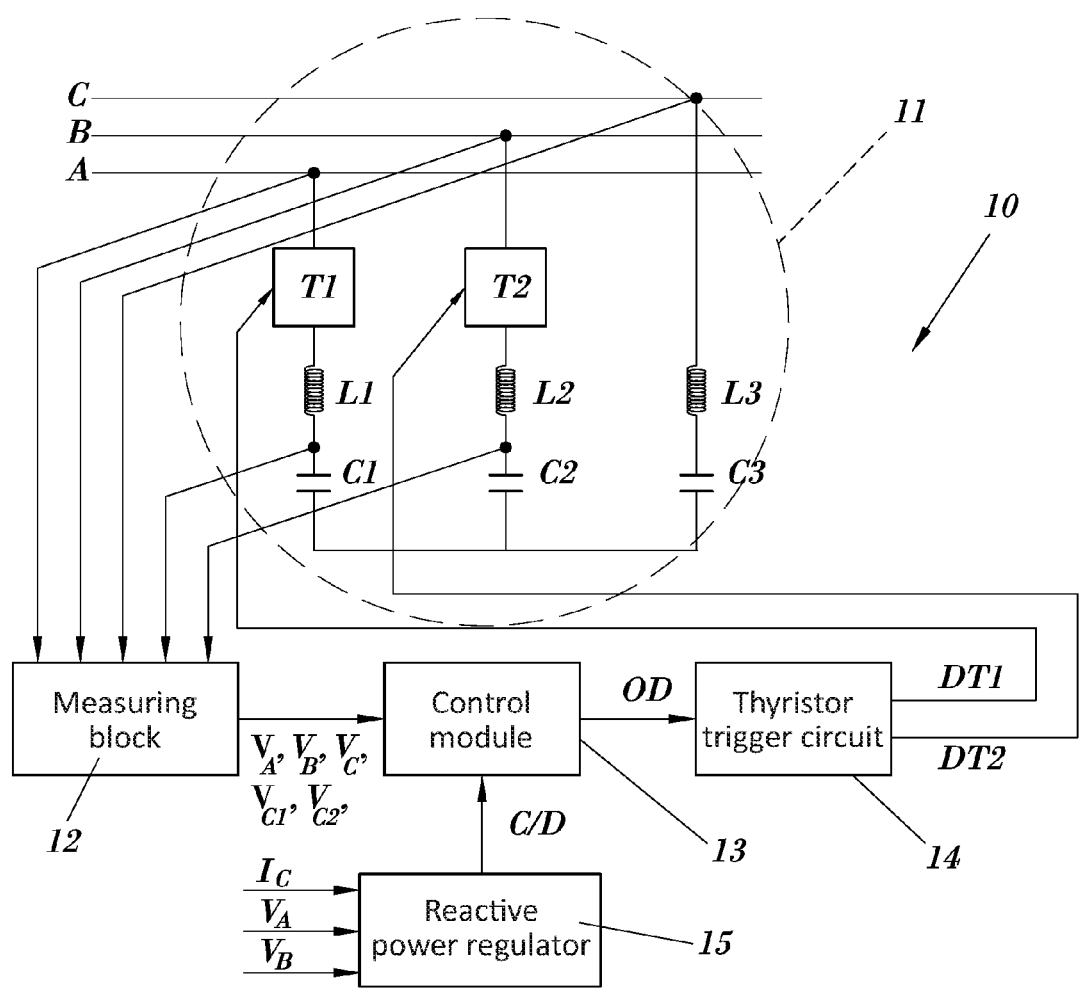
FIG. 1 depicts a circuit diagram of the system according to an embodiment of the present invention.

FIG. 1 shows a circuit diagram of the system according to an embodiment of the present invention. The system 10 comprises: a switching sub-system 11, a voltage sensing or measuring block 12, a control module 13, a thyristor trigger circuit 14 and a reactive power regulator 15.

The switching sub-system 11 is responsible for the switching strategy or operating sequence. The inputs of this sub-system are three voltage lines A B C of the three-phase system. The switching sub-system 11 comprises three branches, each of which is connected to one of the voltage lines A B C: two branches with thyristors T1 T2 and a third branch with a direct connection to the capacitor banks, which are described below. As can be seen, the sub-system comprises three serial L-C (coil-capacitor) groups L1-C1 L2-C2 L3-C3. The first two are directly connected to the respective thyristors T1 T2 and the third one is in a branch without a thyristor.

This switching strategy depends on the phase sequence. The opening and closing sequence is important in that it determines the maximum voltages of the system in the case of the opening sequence and the zero crossing condition in the case of the closing sequence.

The voltage sensing or measuring block 12 measures the three voltages of the voltage lines A B C ($V_A$, $V_B$, $V_C$) and the two voltages at the output of the thyristors T1 T2 (specifically at the input of the capacitors C1 C2) $V_{C1}$ $V_{C2}$ and provides these five voltages to control module 13.

The control module 13 takes as inputs the five voltages $V_A$ $V_B$ $V_C$ $V_{C1}$ $V_{C2}$ and a connect/disconnect order C/D from the reactive power regulator 15, which in turn takes as inputs the voltages of the branches A and B ($V_A$ $V_B$) and the current of the branch C ($I_C$). The control module 13, which is described in detail below, provides as output a trigger order OD which serves to activate the thyristor trigger circuit 14 or not, This thyristor trigger circuit 14 provides as output two thyristor trigger signals DT1 DT2 which are directly connected to the respective thyristors T1 T2 and serve to activate them.

Figure 3:
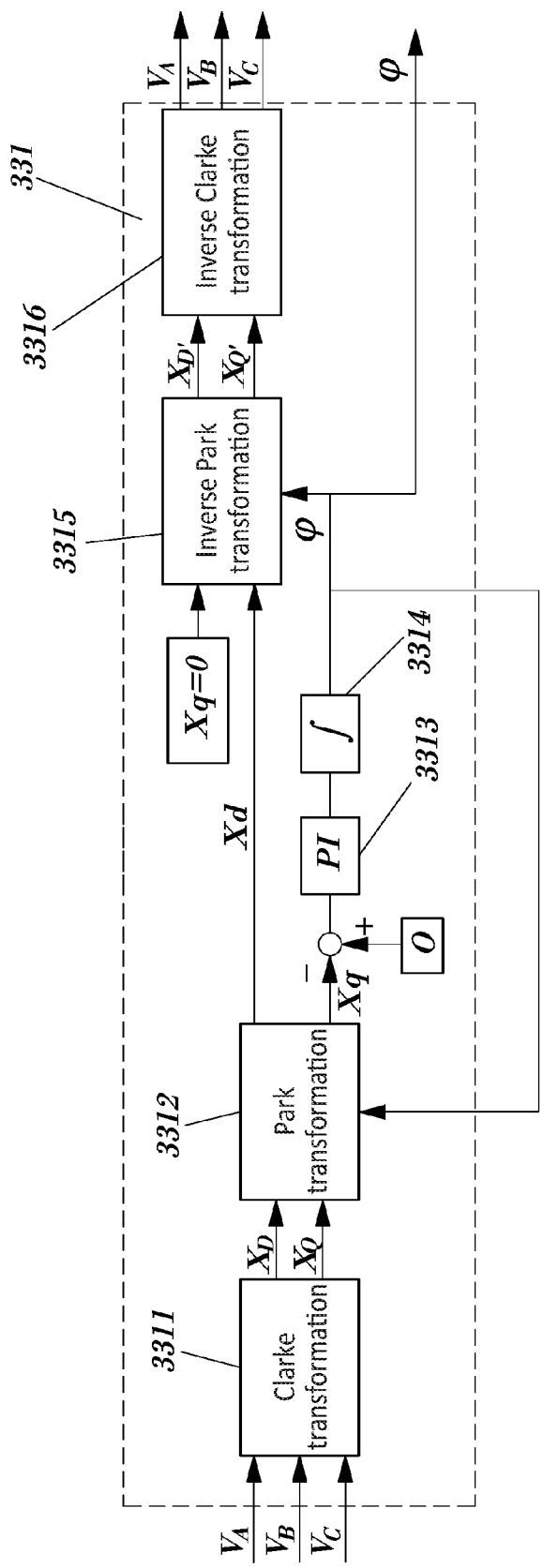
FIG. 3 depicts a PLL of the control module according to an embodiment of the present invention.

As will be described below, the PLL is only applied to voltages $V_{AB}$ and $V_{BC}$, since it always needs for there to be non-zero voltage. The need for non-zero voltage occurs in the proportional integral control of the PLL (FIG. 3). The operating principle of the PLL is based on reproducing the angle of the periodic sinusoidal signal to be able to reconstruct an image signal from the original which is subsequently filtered without delay. As will be explained below, the Clarke transformation which converts the original three-phase system into an orthogonal two-axis system is used to do this. This system is subsequently rotated with the same angle as the original system using the Park transformation. The zero-sequence component, which is zero in a balanced three-phase system, the direct component and the quadrature component are thus obtained. Mathematically, the transformation is carried out by means of transition matrices between each of the steps, applicable to any three-phase signal system for obtaining the direct d, quadrature q and zero-sequence 0 component equivalents. The objective is to obtain the real phase angle of the original three-phase network such that the original system $V_a$ $V_b$ $V_c$ can be reproduced.

The process is as follows:

Applying the Clarke transformation from the phase-to-phase voltages Vab and Vac, which results in two orthogonal components VD VQ.

Applying the Park transformation by means of the rotation of a determined angle of the orthogonal components VD VQ, which results in $V_d$ $V_q$.

Applying a proportional integral (PI) control for calculating the angle φ whereby the system rotates. To that end, the quadrature component must be zero ($V_q$=0), which means that the system will rotate at the same speed as the original measured three-phase system. The output of the PI is the speed at which the new system of coordinates rotates and after passing it through an integrator, the angle whereby the system rotates is obtained.

The following steps are geared towards generating the image signal identical to the original one from the obtained information.

Applying the inverse Park transformation from the calculated angle φ and from cancelling the quadrature component to obtain the two orthogonal components VD_image VQ_image.

Applying the inverse Clarke transformation from the orthogonal components VD_image VQ_image to obtain the three-phase components of the image signal of the input $V_{a\_image}$ $V_{b\_image}$ $V_{c\_image}$.

The input signal is thus accurately reproduced with notches and all the original disturbances the measured signal had, though slightly filtered due to the PI.

The next step is to select the suitable filter which removes the disturbances but does not introduce any delay. A notch filter with an all-pass structure is preferably chosen. Filters of this type are capable of retaining a determined signal frequency, removing the remaining frequencies for that purpose.

The process for removing the disturbances is as follows;

The measured original signal is entered in the algorithm of the PLL, which results in the angle of the original signal and the reproduced image signal.

The estimated angle is used for calculating the constants of the notch filter. It must be taken into account that the angle of the signal, or its speed, are variables around a determined frequency (for example, 60 Hz), so the calculation must be performed continuously. A number of constants (in a particular embodiment, 9, giving rise to a 3×3 matrix) is calculated, although some of these values can be zero.

The image signal and the constants are entered in the algorithm of the all-pass filter. The output of this algorithm is the inverted image signal, "its non-sinusoidal part", i.e., the frequencies that are not the fundamental frequency.

The image signal is added to the output signal of the all-pass filter, resulting in the removal of all the frequencies that are not the fundamental frequency and giving rise to an output signal that is twice the image signal at the fundamental frequency.

Finally, the signal is divided by two and the final result is the image signal filtered at the fundamental frequency from which all the remaining frequencies have been removed without introducing a delay.

This is detailed below in relation to FIGS. 2 to 5.

Figure 2:
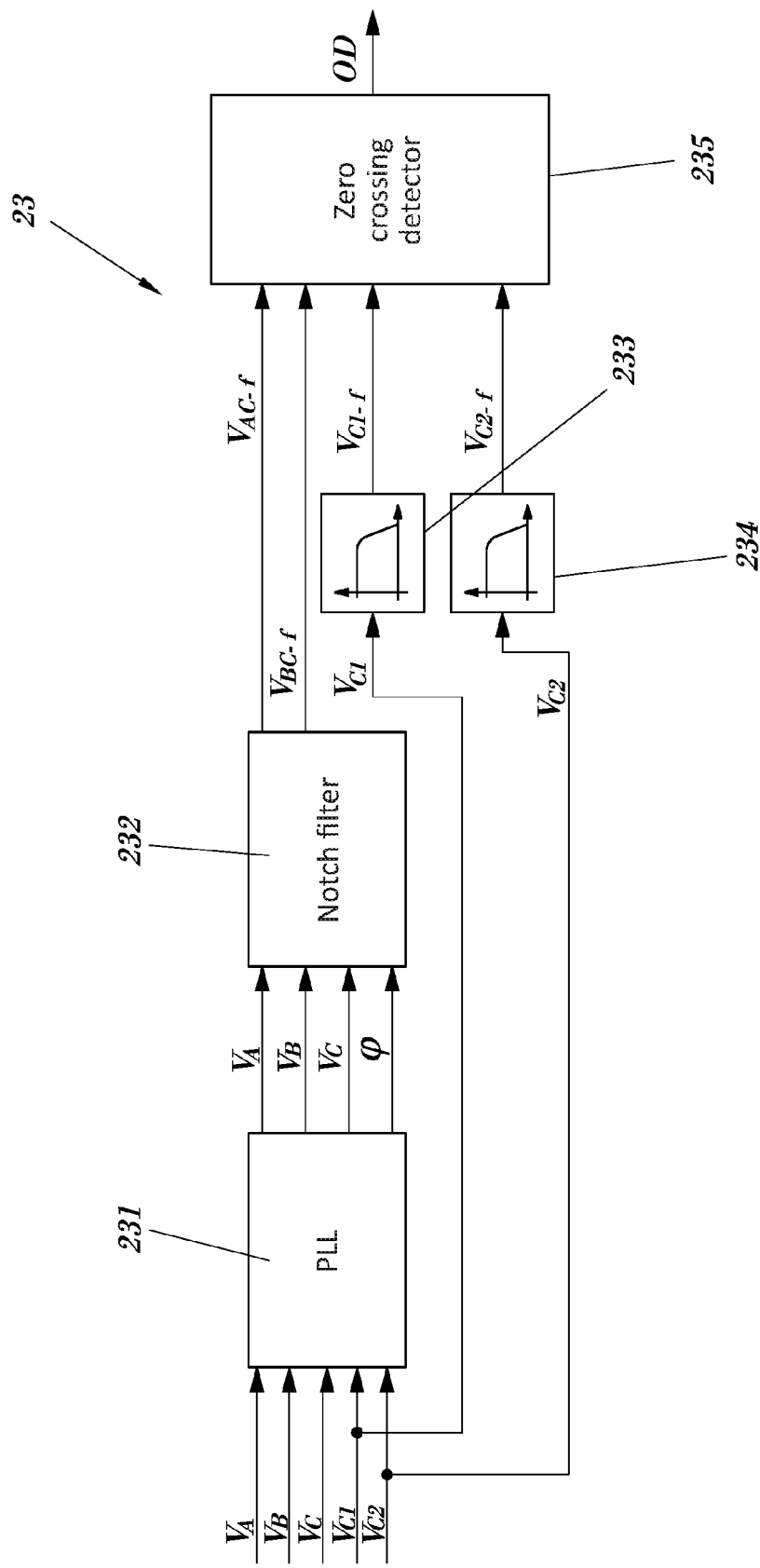
FIG. 2 depicts a control module of the system according to an embodiment of the present invention.

FIG. 2 depicts a diagram of the control module 13 which has reference number 23 in this figure. The control module 23 is responsible for detecting the zero crossing when the network voltage signals present disturbances causing zero crossings different from the natural network voltage zero crossings.

To that end, the control module 23 comprises a PLL (phase lock loop) 231 for obtaining an accurate image of the voltage signals of the network voltages ($V_A$ $V_B$ $V_C$) and of the phase angle of the system ($\phi$). The PLL 231 is described in detail below. The PLL 231 is connected to a notch filter 232 which offers at its output the filtered voltage ($V_{AC\_f}$) between lines A and C and the filtered voltage ($V_{BC\_f}$) between lines B and C. These two signals ($V_{AC\_f}$, $V_{BC\_f}$) together with the filtered signals ($V_{C1\_f}$, $V_{C2\_f}$) filtered by two filters 233 234 for the voltages $V_{C1}$ $V_{C2}$ in the two capacitors $C_1$ $C_2$ are the input of a zero crossing detector 235 which provides the trigger order OD.

The PLL 231 is described in detail below according to the diagram of FIG. 3, in which the PLL has reference number 331. The objective is to accurately reproduce the disturbed network voltage signal and to further calculate the value of its frequency. The PLL is only applied to phase-to-phase voltage ($V_{BC}$ $V_{AC}$) signals.

Firstly, a Clarke transformation 3311 is applied to phase-to-neutral voltage $V_A$ $V_B$ $V_C$ signals. The Clarke transformation 3311 converts a balanced three-phase system into a balanced two-phase quadrature system $X_D$ $X_Q$, described for example by Texas Instruments, Digital Control Systems (DCS) Group, "Clarke variable transformation". In a particular embodiment, the Clarke transformation is carried out within an interrupt function executed every 40 kHz. It can alternatively be executed at another frequency.

A Park transformation 3312 is then applied to the two-phase quadrature $X_D$ $X_Q$. This Park transformation 3312 converts an orthogonal stationary two-phase system $X_D$ $X_Q$ into a rotating orthogonal system $X_d X_q$, as described for example by Texas Instruments, Digital Control Systems (DCS) Group, "Park variable transformation". The angle of this rotation is obtained from the PLL. In a particular embodiment, the Park transformation is carried out within an interrupt function executed every 40 kHz after the Clarke transformation. It can alternatively be executed at another frequency.

Then a PID (proportional-integral-derivative) is applied to obtain the rotation frequency of the system. As is known, a PID is a feedback control mechanism which corrects the error between a measured value and the value to be obtained, calculating it and then obtaining a corrective action which can adjust to the process accordingly. In this case, the objective of the control PID 3313, described for example by Texas Instruments, "Digital PID Controller with Anti-windup", is to obtain the rotation speed of the electric network. This is achieved by canceling the Park quadrature component of the network voltage, the effect of which is to transform the Park quadrature and direct component system into a direct component system which rotates at the speed of the electric network. The PID 3313 is responsible for cancelling the quadrature component providing at its output the frequency of the electric network w or rotation speed of the system.

Once the rotation speed of the system is obtained, the next step is to calculate the rotation angle of the network. To calculate the rotation angle of the network, the rotation speed obtained from the output of the PID 3313 must be integrated 3314. Preferably the trapezoidal integration method is used. All the necessary information for accurately reproducing the input voltage signals with all their disturbances are therefore available.

Then the transformations are inverted to again have a three-phase system. To that end, an inverse Park transformation 3315 is applied.

As its name indicates, the inverse Park transformation inverts the Park transformation. In other words, it converts the quadrature rotating reference frame into an orthogonal stationary two-phase system. To achieve this, the Park quadrature component $X_q$ and direct component $X_d$ are introduced. Preferably, the quadrature component is zero $X_q$=0. The calculated network angle $\phi$ is also introduced to calculate the cosine and sine thereof.

Once the inverse Park transformation is calculated, the inverse Clarke transformation 3316 is calculated to have an image of the original three-phase system.

As its name indicates, the inverse Clarke transformation inverts the Clarke transformation. In other words, it converts the two-phase orthogonal stationary system $X_D'$ $X_Q'$, obtained as output of the inverted Park transformation 3315 into a balanced three-phase system. With the output variables of the inverse Park transformation $X_D'$ $X_Q'$, the image voltages of those of the original system are calculate and from these the phase-to-neutral voltages $V_A$ $V_B$ $V_C$ are calculated from the calculated phase-to-phase voltages $V_{BC}$ $V_{AC}$. The sensed voltage signals to which the notch filter 232 will be applied to remove the disturbances and obtain sinusoidal signals are thus reproduced.

Figure 4:
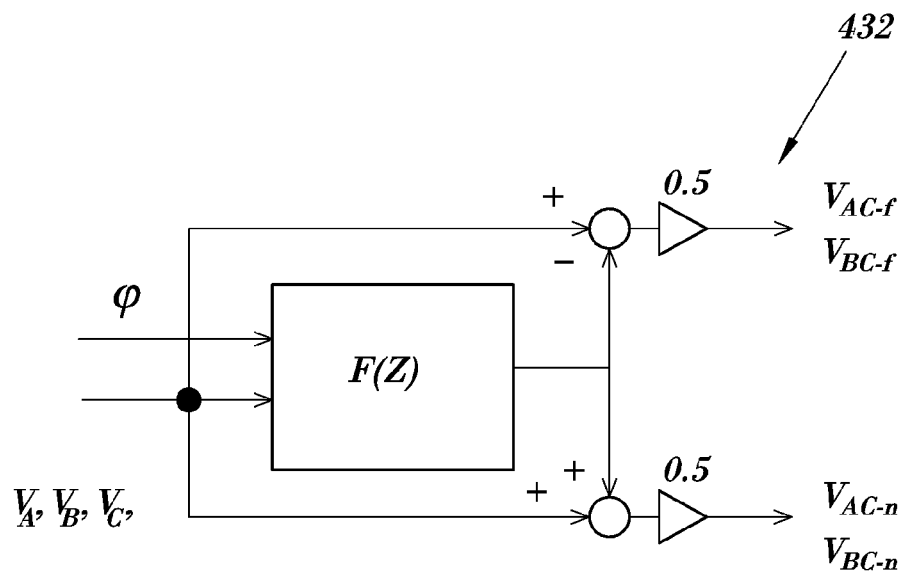
FIG. 4 depicts a notch filter of the control module according to an embodiment of the present invention.

The notch filter 232 of FIG. 2 located at the output of the PLL 231 331 is described below in detail. In FIG. 4, the notch filter has reference number 432.

Adaptive notch filters can be used to analyze and obtain an unknown sinusoidal frequency signal further presenting noise in its entire spectrum.

Preferably, the notch filter 432 used is an all-pass filter type. More preferably, a planar rotation lattice filter is used. This type of notch filter has been chosen because its structure is theoretically stable and has good numerical performance in environments that change over time.

This filter does not introduce gain in the analyzed signal and its response in frequency is the same signal the frequency corresponding to a selected bandwidth only 180° out of phase. This frequency intended to be out of phase is the frequency of the network, which is continuously calculated by means of a PLL.

As input, the notch filter 432 needs the network angle $\phi$ and phase-to-neutral voltages $V_A V_B V_C$. The filter 432 offers at its output the signal without disturbance $V_{BC\_f}$ $V_{AC\_f}$ and the output of the disturbance $V_{BC\_n}$ $V_{AC\_n}$. The constants of the filter depend on the bandwidth of the notch and on the frequency of the network. The bandwidth of the notch does not change over time.

Figure 5:
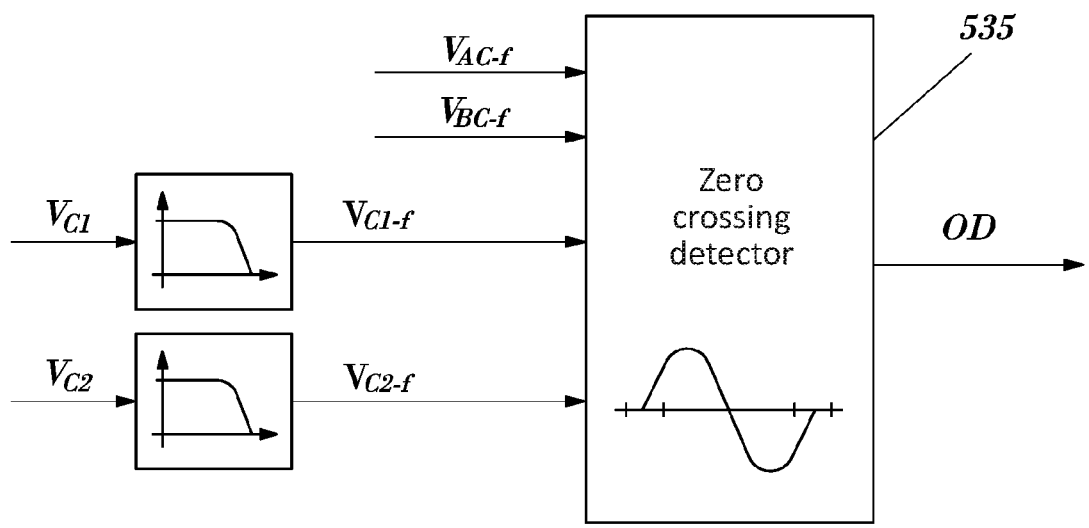
FIG. 5 depicts a zero crossing detector of the control module according to an embodiment of the present invention.

Finally, FIG. 5 depicts the zero crossing detector 235 535 of FIG. 2 which gives a trigger order OD from the filtered signals upon detecting a zero crossing.

The invention claimed is:

1. A system for monitoring (10) an electric network voltage waveform, comprising:
  switching means (11) connected to voltage lines (A, B, C) of a three-phase system, wherein said means (11) comprise two thyristors (T1, T2) connected to two of the voltage lines (A, B, C) and at least two capacitors (C1, C2) connected to said thyristors (T1, T2), said means (11) being configured to open and close said thyristors (T1, T2) in response to a corresponding trigger signal (DT1, DT2);
  means for measuring (12) the voltages in said voltage lines and at the input of said capacitors ($V_A$, $V_B$, $V_C$, $V_{C1}$, $V_{C2}$);

a thyristor trigger circuit (14) configured to provide the trigger signal from a trigger order (OD) to either thyristor (DT1, DT2) when the voltage in the terminals of said thyristor (T1, T2) crosses zero;

control means (13, 23) configured to give said trigger order (OD) based on the measured voltages ($V_A$, $V_B$, $V_C$, $V_{C1}$, $V_{C2}$);

wherein said control means (13, 23) comprise:

a PLL (231, 331) configured to obtain an image signal from the voltage signals of said voltage lines (A, B, C), from a phase angle ($\phi$) of the three-phase system and from a temporal variation thereof;

the system being characterized by:

an adaptive notch filter (232, 432) disposed at the output of said PLL (231, 331), wherein the constants of said adaptive notch filter (232, 432) are calculated from the derivative of said phase angle ($\phi$), configured to provide filtered voltage signals between the voltage lines ($V_{AC\_f}$, $V_{BC\_f}$), wherein said filtered signals can represent frequencies different from the fundamental frequency;

means for filtering the measured voltages at the input of the capacitors ($V_{C1\_f}$, $V_{C2\_f}$);

a zero crossing detector (235, 535) configured to provide said trigger order (OD) from said filtered voltages ($V_{ACf}$, $V_{BCf}$, $V_{C1f}$, $V_{C2f}$);

and wherein said PLL (231, 331) comprises:

means for applying a Clarke transformation (3311) to the voltage signals ($V_A$ $V_B$ $V_C$) to convert the balanced three-phase system into an orthogonal stationary quadrature two-phase system ($X_D X_Q$);

means for applying a Park transformation (3312) to the two-phase quadrature ($X_D X_Q$) to convert the orthogonal stationary two-phase system ($X_D X_Q$) into a rotating orthogonal system ($X_d X_q$);

means for applying a proportional-integral-derivative control (3313) to obtain the rotation speed of the system and the frequency of the original electrical system;

means (3314) for integrating said rotation speed and calculating the phase angle of the voltage from the rotation speed of the system;

means for obtaining an inverse Park transformation (3315) to convert the quadrature rotating reference frame into an orthogonal stationary two-phase system ;

means for obtaining the inverse Clarke transformation (3316) to obtain an image of the original three-phase system ($V_A V_B V_C$).

2. The system (10) of claim 1, wherein said switching means (11) further comprise an inductor (L1, L2) located between each thyristor (T1, T2) and the corresponding capacitor (C1, C2).

3. The system (10) of claim 1, wherein said adaptive notch filter (232, 432) is an all-pass filter.

4. The system (10) of claim 3, wherein said all-pass filter is a planar rotation lattice filter.

5. The system (10) of claim 1, wherein said control means (13, 23) and said thyristor trigger circuit (14) are configured to send the corresponding trigger signals (DT1, DT2) when the following three conditions are simultaneously met:

the trigger order (OD) is received;

the voltage in the terminals of the thyristor is the same;

the previous condition is not due to a disturbance.

6. The system (10) of claim 1, further comprising a reactive power regulating module (15) configured to provide a connect/disconnect (C/D) order to said control means (13, 23).

7. The system of claim 1, wherein the system for monitoring (10) the electric network voltage waveform is provided in a static switch.

8. The system of claim 1, wherein the system is configured for calculating the zero crossings of the electric network voltage signal.

* * * * *